US011940223B2

(12) United States Patent
Kim et al.

(10) Patent No.: US 11,940,223 B2
(45) Date of Patent: Mar. 26, 2024

(54) WICK STRUCTURE OF HEAT PIPE

(71) Applicant: KOREA ATOMIC ENERGY RESEARCH INSTITUTE, Daejeon (KR)

(72) Inventors: Chan Soo Kim, Daejeon (KR); Byung Ha Park, Sejong-si (KR); Yong Wan Kim, Daejeon (KR); Sung-Deok Hong, Daejeon (KR); Minhwan Kim, Sejong-si (KR)

(73) Assignee: KOREA ATOMIC ENERGY RESEARCH INSTITUTE, Daejeon (KR)

( * ) Notice: Subject to any disclaimer, the term of this patent is extended or adjusted under 35 U.S.C. 154(b) by 261 days.

(21) Appl. No.: 17/223,215

(22) Filed: Apr. 6, 2021

(65) Prior Publication Data
US 2021/0325123 A1    Oct. 21, 2021

(30) Foreign Application Priority Data
Apr. 20, 2020   (KR) .................. 10-2020-0047508

(51) Int. Cl.
*F28D 15/04*   (2006.01)
*F28D 15/02*   (2006.01)
*F28F 13/00*   (2006.01)

(52) U.S. Cl.
CPC ....... *F28D 15/046* (2013.01); *F28D 15/0241* (2013.01); *F28D 15/0266* (2013.01); *F28F 13/003* (2013.01); *F28F 2255/18* (2013.01)

(58) Field of Classification Search
CPC ............... F28D 15/046; F28D 15/0241; F28D 15/0266; F28F 13/003; F28F 2255/18
(Continued)

(56) References Cited

U.S. PATENT DOCUMENTS 7,137,442 B2 * 11/2006 Kawahara ........... F28D 15/0233
                                                   165/104.21
7,828,046 B2   11/2010 Huang
(Continued)

FOREIGN PATENT DOCUMENTS

JP    1997-170888    6/1997
JP    2000-171181    6/2000
(Continued)

OTHER PUBLICATIONS

Dhananjay Dilip Odhekar, "Experimental Investigation of Bendable Heat Pipes", A Thesis Submitted to the Graduate Faculty of Auburn University, Aug. 8, 2005.
(Continued)

*Primary Examiner* — Joel M Attey
(74) *Attorney, Agent, or Firm* — LEX IP MEISTER, PLLC

(57) ABSTRACT

According to an embodiment, a wick structure of a heat pipe that is capable of bending while increasing a heat transferring operation limit value is provided by improving the wick structure provided inside the heat pipe. The wick structure of the heat pipe includes a plurality of wicks provided inside a heat pipe, wherein the plurality of wicks include: a first wick provided at one side of a length direction to correspond to a condenser section of a heat pipe; a second wick having one side elongated to be connected to the first wick and provided at an adiabatic section of the heat pipe; and a third wick having one side connected to the other side of the second wick to correspond to an evaporator section of the heat pipe and provided at the other side in the length direction, and the first wick, the second wick and the third wick have effective pore radiuses and pore structures that are different from each other and maintain a movement and a capillary force of an
(Continued)

working fluid supplied to the inside of the heat pipe when bending the heat pipe.

8 Claims, 7 Drawing Sheets

(58) Field of Classification Search
USPC .................................................. 165/104.26
See application file for complete search history.

(56) References Cited

U.S. PATENT DOCUMENTS

| | | | |
|---|---|---|---|
| 9,618,275 | B1 | 4/2017 | Anderson et al. |
| 9,752,832 | B2* | 9/2017 | Kare ........................ F28D 15/04 |
| 2001/0047859 | A1* | 12/2001 | Ishida ................... B21C 37/151 |
| | | | 165/104.21 |
| 2005/0257917 | A1* | 11/2005 | East .......................... F28F 3/12 |
| | | | 257/E23.098 |
| 2017/0211795 | A1 | 7/2017 | Kadijk et al. |
| 2019/0264987 | A1* | 8/2019 | Sun ........................ F28D 15/046 |
| 2019/0354148 | A1* | 11/2019 | Delano ................... G06F 1/203 |

FOREIGN PATENT DOCUMENTS

| | | |
|---|---|---|
| JP | 2015-121373 | 7/2015 |
| JP | 2017-072340 | 4/2017 |
| KR | 20010062646 | 7/2001 |
| KR | 10-2002-0030339 | 4/2002 |
| KR | 10-2039137 | 11/2019 |

OTHER PUBLICATIONS

Wenjie Zhou et al., "A novel ultra-thin flattened heat pipe with biporous spiral woven mesh wick for cooling electronic devices", Energy Conversion and Management 180 (2019) 769-783, https://doi.org/10.1016/j.enconman.2018.11.03.

Yong Tang et al., "Experimental investigation of capillary force in a novel sintered copper mesh wick for ultra-thin heat pipes", Applied Thermal Engineering 115 (2017) 1020-1030, http://dx.doi.org/10.1016/j.applthermaleng.2016.12.056.

* cited by examiner

WICK STRUCTURE OF HEAT PIPE

CROSS-REFERENCE TO RELATED APPLICATION

This application claims priority to and the benefit of Korean Patent Application No. 10-2020-0047508 filed in the Korean Intellectual Property Office on Apr. 20, 2020, the entire contents of which are incorporated herein by reference.

BACKGROUND OF THE INVENTION

(a) Field of the Invention

A wick structure of a heat pipe is provided.

(b) Description of the Related Art

Recently, various heat transfer devices have been used to effectively transfer heat. Among these heat transfer devices, a heat pipe uses a heat transfer by latent heat of a working fluid. The heat pipe is one of heat transferring modules and the working fluid is circulated inside the heat pipe. Inside the heat pipe, a wick structure for effectively transporting the fluid by using a capillary phenomenon is provided. The wicks of the heat pipe include a screen wick, an artery wick, a groove wick, and a sintered wick.

In the case of the heat pipe using the artery wick or the screen wick, a flow path through which a liquid is transferred may be damaged during bending, so an operating limit value of the heat pipe may be greatly reduced. When such heat pipe is applied to a nuclear reactor, there is a concern about life-related problems during long-term operation. Accordingly, in the case of the heat pipe that cools a nuclear reactor core in a space reactor, it is required to develop the wick of the heat pipe capable of bending while increasing the heat transferring operation limit value.

As a related prior art, Korean Patent No. 497,332 discloses "Heat pipe having a sintered wick structure and manufacturing method thereof".

SUMMARY OF THE INVENTION

An embodiment is to provide a wick structure of a heat pipe capable of bending while increasing a heat transferring operation limit value by improving a wick structure provided inside a heat pipe.

A wick structure of a heat pipe according to an embodiment includes a plurality of wicks provided inside a heat pipe, wherein the plurality of wicks include: a first wick provided at one side of a length direction to correspond to a condenser section of a heat pipe; a second wick having one side elongated to be connected to the first wick and provided at an adiabatic section of the heat pipe; and a third wick having one side connected to the other side of the second wick to correspond to an evaporator section of the heat pipe and provided at the other side of in length direction, and the first wick, the second wick, and the third wick have effective pore radiuses and pore structures that are different from each other, and maintain a movement and a capillary force of an working fluid supplied to the inside of the heat pipe when bending the heat pipe.

According to an embodiment, the wick structure of the heat pipe may be maintained without reducing the heat transferring operation limit value even when bending the heat pipe while increasing the heat transferring operation limit value.

According to an embodiment, during natural circulation of the working fluid inside the heat pipe, a pressure drop of the liquid flow may be minimized to maximize a capillary operation limit value of the heat pipe.

DETAILED DESCRIPTION OF THE EMBODIMENTS

Figure 1:
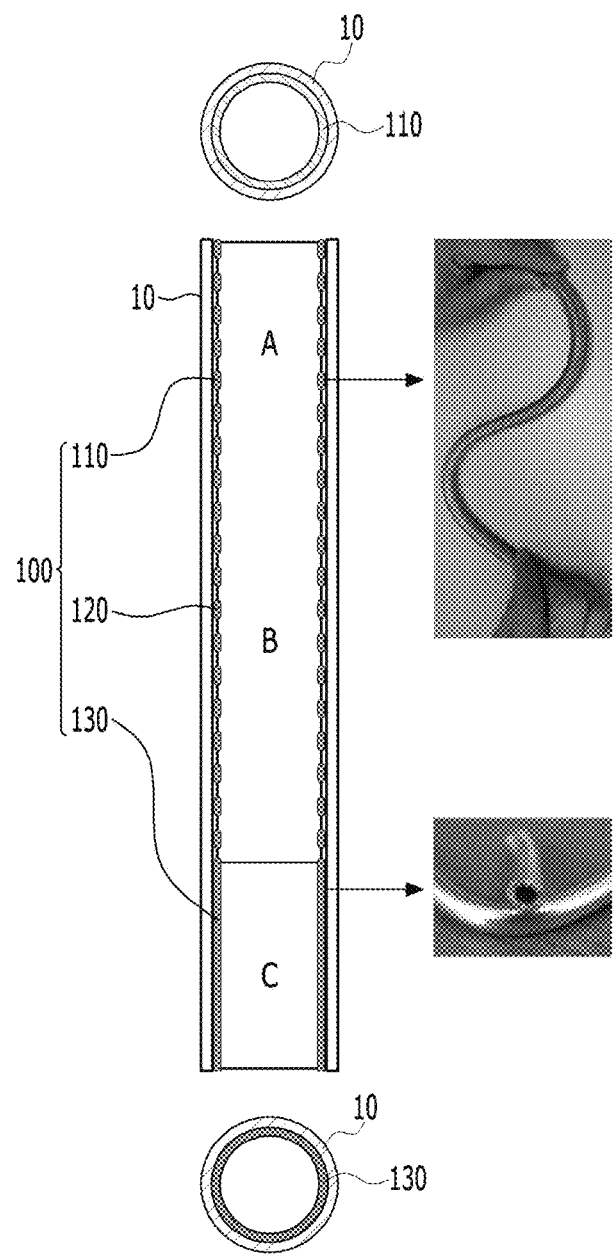
FIG. 1 is a view showing a wick structure of a heat pipe according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention. In order to clearly explain the present invention, portions that are not directly related to the present invention are omitted, and the same reference numerals are attached to the same or similar constituent elements through the entire specification. In addition, in cases of well-known technologies, detailed descriptions thereof will be omitted.

Throughout the specification, unless explicitly described to the contrary, the word "comprise", and variations such as "comprises" or "comprising", will be understood to imply the inclusion of stated elements but not the exclusion of any other elements.

Hereinafter, a wick structure of a heat pipe is described in detail with reference to accompanying drawings.

Figure 2:
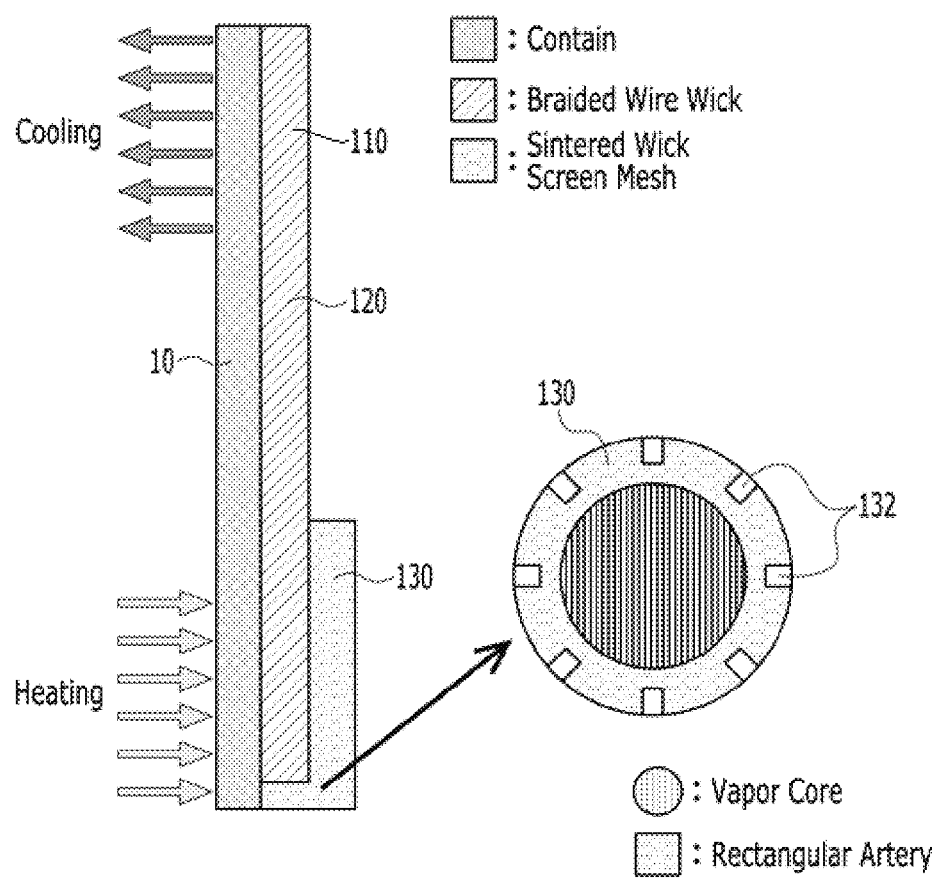
FIG. 2 is a view showing a coupling relationship of a wick structure of a heat pipe according to an embodiment.

FIG. 1 is a view showing a wick structure of a heat pipe according to an embodiment, and FIG. 2 is a view showing a coupling relationship of a wick structure of a heat pipe according to an embodiment.

Referring to FIG. 1 and FIG. 2, a wick structure of a heat pipe includes a plurality of wicks 100 provided inside a heat pipe 10. Accordingly, the wick structure of the heat pipe may be maintained without reducing the heat transferring operation limit value even when the heat pipe 10 is bent while increasing the heat transferring operation limit value.

A plurality of wicks 100 includes a first wick 110, a second wick 120, and a third wick 130. The first wick 110, the second wick 120, and third wick 130 may have effective pore radiuses and pore structures that are different from each other, Accordingly, even when the heat pipe 10 is bent, the movement and a capillary force of the working fluid supplied inside the heat pipe 10 may be maintained.

The first wick 110 may be provided at one side of the length direction to correspond to a condenser section A of the heat pipe 10.

The second wick 120 has one side elongated to be connected to the first wick 110 and may be provided at an adiabatic section B of the heat pipe 10. The first wick 110 and the second wick 120 may have the same effective pore radius and pore structure, and both may be integrally formed. Also, the first wick 110 and the second wick 120 may be formed in a structure capable of bending.

Figure 7:
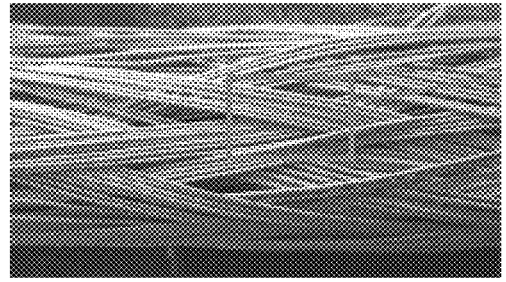
FIG. 7 is a view showing a wick with a spiral woven mesh structure.

For example, referring to FIG. 7, the first wick 110 and the second wick 120 may include a spiral woven mesh structure. The first wick 110 and the second wick 120 may include a spiral woven mesh type of wick formed by weaving in a helical direction, and thus a capillary force may be provided to the working fluid supplied inside the heat pipe 10. The first wick 110 and the second wick 120 may include a braided sleeve structure. Unlike the screen wick, the braided sleeve is easy to insert into the heat pipe 10, thereby having excellent processability. A spiral woven mesh or a braided sleeve may be used as the first wick 110 and the second wick 120 respectively corresponding to the adiabatic section B and the condenser section A of the heat pipe 10, and accordingly, the heat pipe 10 may be easily bent in the adiabatic section B or the condenser section A.

A braided wick structure in which the effective pore radius of the first wick 110 and the second wick 120 is larger than the effective pore radius of the third wick 130 may be utilized. Accordingly, the adiabatic section B and the condenser section A of the heat pipe 10 may be formed to be bent without deteriorating the operation limit value of the heat pipe 10. The first wick 110 and the second wick 120 may be formed of the same structure. Hereinafter, when a clear distinction between the first wick 110 and the second wick 120 is unnecessary, only the second wick 120 may be expressed for convenience.

One side of the third wick 130 may be connected to the other side of the second wick 120 to correspond to the evaporator section C of the heat pipe 10. The diameter of the third wick 130 may be made smaller than the tube interior diameter of the heat pipe 10, so that an annular artery may be secured. In addition, the third wick 130 may have a smaller effective pore radius than the effective pore radius of the first wick 110 or the second wick 120, and may have a different pore structure from the first wick 110 and the second wick 120. The third wick 130 may include a sintered wick. The effective pore radius of the sintered wick corresponding to the evaporator section C may be formed smaller than the effective pore radius of the first wick 110 and the second wick 120, thereby maximizing the capillary force. The smaller the size of the effective pore radius, the more advantageous in terms of the capillary force, but it may be disadvantageous in terms of a liquid flow pressure drop. Since the size of the effective pore radius of the heated evaporator section C is important for the capillary force, only the evaporator section C may use the sintered wick with a small size of the effective pore radius. For example, by using the sintered wick having the small effective pore radius in the evaporator section C, the capillary force of the heat pipe 10 may be maximized. The large pore size of the second wick 120 and the annular artery of the third wick 130 may reduce the pressure drop of the liquid flow, thereby maximizing the operation limit value of the capillary heat pipe 10 of the heat pipe 10. The annular artery of the sintered wick may be provided in the evaporator section C, and the first wick 110 and the second wick 120, which are relatively large compared to the sintered wick, may be installed in the adiabatic section B and the condenser section A. Accordingly, the pressure drop of the liquid flow may be minimized during natural circulation of the working fluid inside the heat pipe 10, so that the capillary operation limit value of the heat pipe 10 may be maximized. The pumping effect generated by the capillary force in the capillary structure may supply the working fluid from the condenser section A to the evaporator section C with substantially greater pressure. The capillary force generated in the capillary structure may make the working fluid able to perform a greater amount of useful work within the flow path.

The boundary between the third wick 130 and the second wick 120 may be machined with the third wick 130 to facilitate joining of two wicks in contact with each other. When the wick structure is formed only of the screen wick or the sintered wick, the workability may be low when the length of the screen wick or the sintered wick is long. Since the screen wick must be rolled and inserted into the tube, it may be very difficult to manufacture the heat pipe 10 if the length is long compared to the diameter of the screen wick. In addition, in order to ensure the operation even when the central part of the heat pipe 10 is converted from the condenser section A to the evaporator section C, the continuous recirculation of the internal working fluid must be possible. In addition, the condenser section A and the adiabatic section B may be formed in a different wick structure from that of the evaporator section C to maintain a film flow and to enable bending.

Accordingly, in the wick structure of the heat pipe, the first wick 110 and the second wick 120 may be formed of the braided wick and the third wick 130 may be formed of the sintered wick. Since the braided wick cannot be welded, various coupling methods other than the welding may be used when the second wick 120 and the third wick 130 are combined. For example, the third wick 130 may include a coupling part 132 formed in a predetermined shape in advance at the position at which the second wick 120 is coupled. The coupling part 132 may include at least one coupling groove provided along the circumferential surface. The coupling of the second wick 120 may be easily connected through the coupling part 132 provided in the third wick 130. Referring to FIG. 2, the coupling groove may be provided outside the circumferential surface of the third wick 130. Therefore, the coupling groove of the third wick 130 may be processed as shown in FIG. 2 and the second wick 120 may be inserted into the outside of the third wick 130, thereby the second wick 120 and the third wick 130 may be combined. In addition, the pressure drop of the liquid flow may be minimized by forming an additional rectangular artery or an annular artery outside the third wick 130. An internal thermal connection of the heat pipe 10 and the wick structure may be formed by fixed bonding. The heat pipe 10 may be preheated, so that the wick having the larger interior diameter than that of the heat pipe 10 may be easily inserted. When the wick is inserted into the heat pipe 10, an excellent thermal joint is formed while the heat pipe 10 cools and contracts. When the wick is inserted into the heat pipe 10, the wick with a large interior diameter may be used. The wick may be contracted and maintained in a state that it is inserted inside the heat pipe 10. The wick structure inserted inside the heat pipe 10 may increase the heat transferring area and improve the movement and the capillary force of the working fluid supplied inside the heat pipe 10.

In the heat pipe 10, the adiabatic section B and the condenser section A may be applied with the grooved wick and the evaporator section C may be applied with the sintered wick. In this case, machining the groove on a stainless steel tube should be processed by electrical discharge machining (EDM), unlike general aluminum or copper tubes. And after processing an outer container of the heat pipe 10 into the evaporator section C, the condenser section A, and the adiabatic section B, the outer container must be welded.

Figure 3:
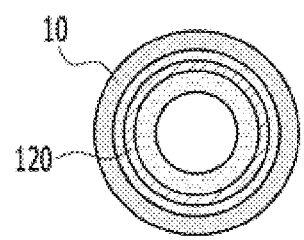
FIG. 3 is a view showing a state that a first wick and a second wick are separated from an inside of a heat pipe according to an embodiment.
Figure 3:
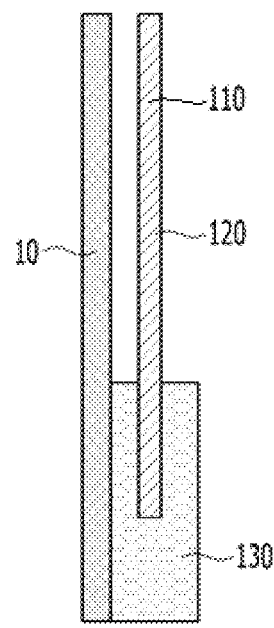
Figure 3:
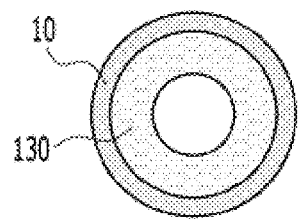
Figure 4:
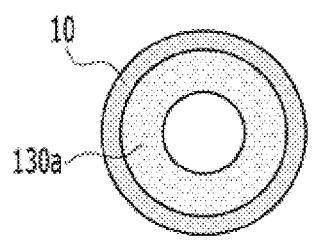
FIG. 4 is a view showing a state in which a first wick and a second wick are supported on an annular supporting part in FIG. 3.
Figure 4:
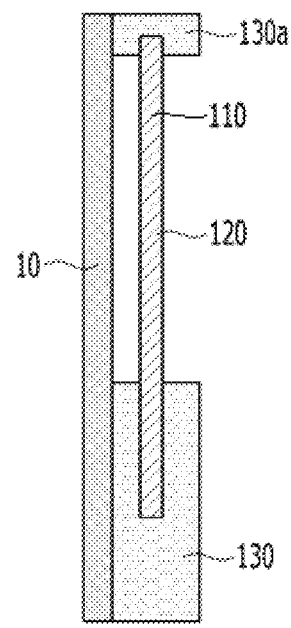
Figure 4:
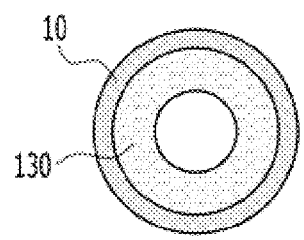
Figure 5:
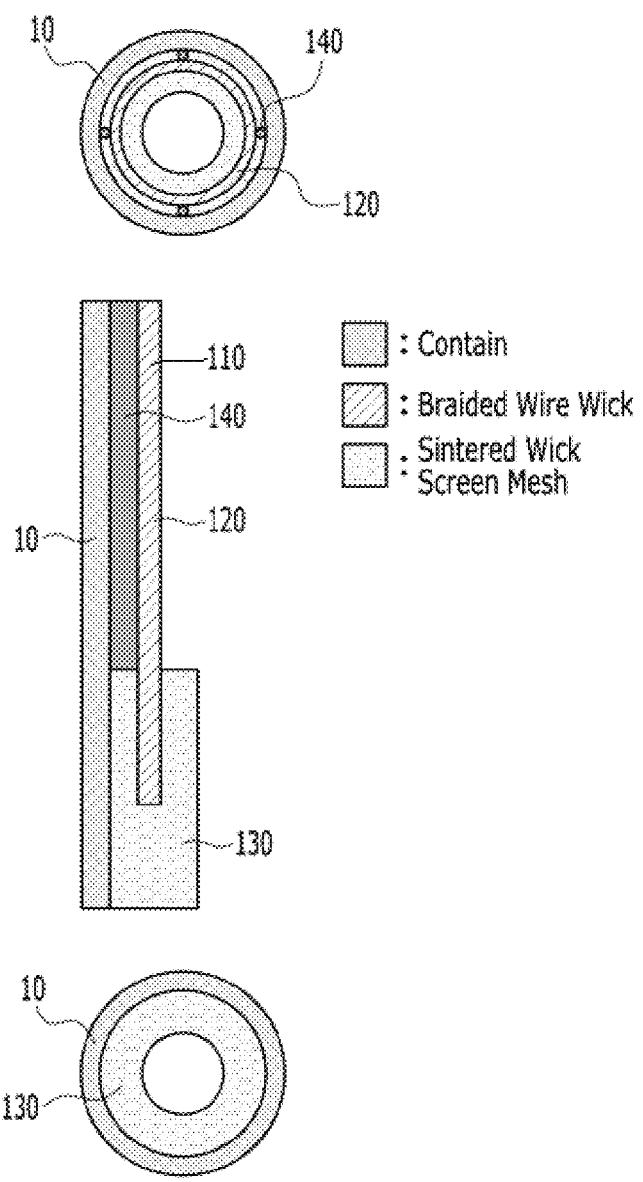
FIG. 5 is a view showing a state in which a first wick and a second wick are supported on a rod-shaped support in FIG. 3.

FIG. 3 is a view showing a state that a first wick and a second wick are separated from an inside of a heat pipe according to an embodiment, and FIG. 4 is a view showing a state in which a first wick and a second wick are supported on an annular supporting part in FIG. 3. FIG. 5 is a view showing a state in which a first wick and a second wick are supported on a rod-shaped support in FIG. 3.

Referring to FIG. 3, the first wick 110 and the second wick 120 may be installed apart from the inner surface of the heat pipe 10. If the pressure drop of the film flow is large due to the long length of the wick structure, the pressure drop of the film flow may be minimized by inserting the second wick 120 in the middle of the third wick 130 and forming the annular artery outside the second wick 120.

Referring to FIG. 4 and FIG. 5, the first wick 110 and the second wick 120 may further include a supporting part to maintain the solid bonding of the first wick 110 and the second wick 120 in the state that the first wick 110 and the second wick 120 are spaced apart from the inner surface of the heat pipe 10. The supporting part may be selectively coupled along the length direction of the first wick 110 and the second wick 120 to guide the first wick 110 and the second wick 120 to be supported on the inner surface of the heat pipe 10.

Referring to FIG. 4, the supporting part may further include an annular supporting part 130a provided with a supporting groove to which one side of the length direction of the first wick 110 is inserted and supporting the first wick 110 to the inner surface of the heat pipe 10. The first wick 110 and the second wick 120 may maintain the annular artery at the end of the condenser section A by the combination of the annular supporting part 130a.

Referring to FIG. 5, the supporting part may include a rod-shaped supporting part 140 that is inserted into the separation space with the heat pipe 10 along the length direction of the first wick 110 and the second wick 120 to support the first wick 110 and the second wick 120 to the inner surface of the heat pipe 10.

The first wick 110 and the second wick 120 may be more easily bent compared to the third wick 130. However, when the bending angle of the wick is large, the shape of the wick may not be maintained, so the first wick 110 and the second wick 120 may further include a reinforcing part.

Figure 6:
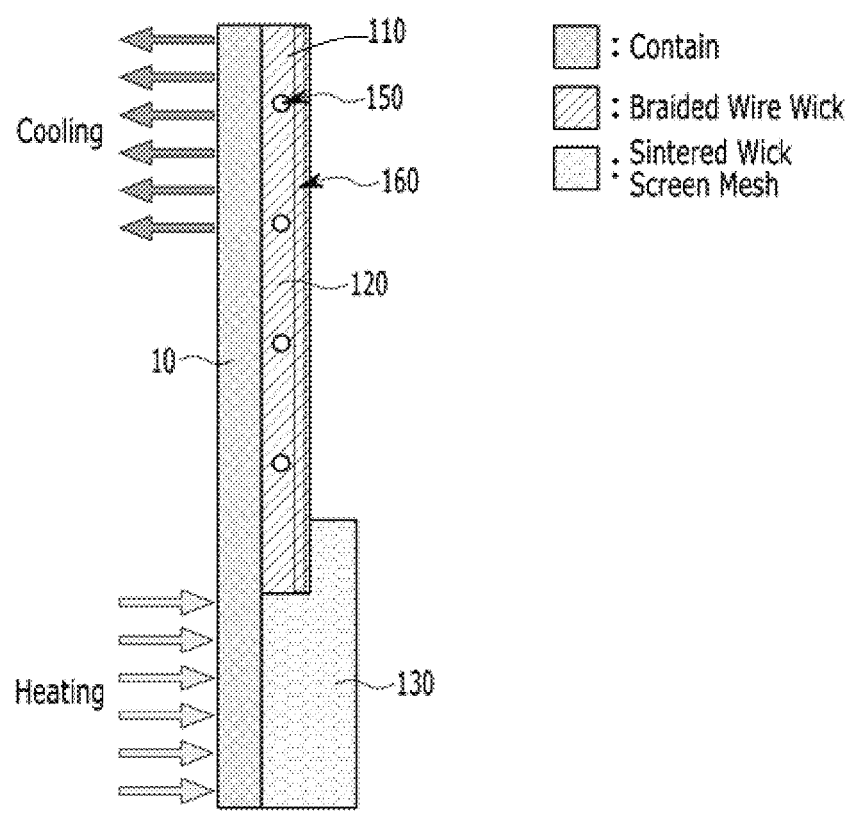
FIG. 6 is a view showing a coupling relationship of a reinforcing part according to an embodiment of the present invention.

FIG. 6 is a view showing a coupling relationship of a reinforcing part according to an embodiment of the present invention. Referring to FIG. 6, the reinforcing part maintaining the shape of the first wick 110 and the second wick 120 may be further included. The reinforcing part may include an annular reinforcing member 150 (an annular stiffener) or a rod-shaped reinforcing member 160 elongated in the length direction. The annular reinforcing member 150 may be provided at regular intervals along the length direction of the first wick 110 and the second wick 120 to maintain the annular shape. By inserting the annular reinforcing member 150 with the regular intervals along the length direction of the braided wick, it helps to maintain the annular shape of the first wick 110 and the second wick 120 and it is easy to bend.

The rod-shaped reinforcing member 160 may be elongated along the length directions of the first wick 110 and the second wick 120. When the lengths of the first wick 110 and the second wick 120 are longer than the predetermined length, the rod-shaped reinforcing member 160 may be inserted long in the length direction. By further including the reinforcing part of the first wick 110 and the second wick 120, the bonding between the sintered wick and the braided wick may be solidly maintained.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A wick structure of a heat pipe, comprising
a plurality of wicks provided inside a heat pipe,
wherein the plurality of wicks include:
a first wick provided at one side of a length direction to correspond to a condenser section of a heat pipe;
a second wick having one side elongated to be connected to the first wick and provided at an adiabatic section of the heat pipe; and
a third wick having one side connected to the other side of the second wick to correspond to an evaporator section of the heat pipe and provided at the other side in the length direction, and
the first wick and the second wick have effective pore radiuses and pore structures that are different from the third wick, and the first wick, the second wick, and the third wick maintain a movement and a capillary force of a working fluid supplied to the inside of the heat pipe when bending the heat pipe,
wherein
the first wick and the second wick are integrally formed with the same effective pore radius and structure as each other, and
the first wick and the second wick are installed to be separated from the inner surface of the heat pipe.

2. The wick structure of the heat pipe of claim 1, wherein the first wick and the second wick are formed into a bendable structure.

3. The wick structure of the heat pipe of claim 2, wherein the first wick and the second wick include a spiral woven mesh structure.

4. The wick structure of the heat pipe of claim 2, wherein the first wick and the second wick include a braided sleeve structure.

5. The wick structure of the heat pipe of claim 1, further comprising
a supporting part selectively coupled along the length direction of the first wick and the second wick, wherein the supporting part guides the first wick and the second wick to be supported by the inner surface of the heat pipe.

6. The wick structure of the heat pipe of claim 1, further comprising
a supporting part coupling the first wick to the inner surface of the heat pipe,
wherein
the supporting part includes an annular supporting part provided with a supporting groove to which one side of the length direction of the first wick is inserted and supporting the first wick to the inner surface of the heat pipe.

7. The wick structure of the heat pipe of claim 1, wherein the third wick has an effective pore radius that is smaller than an effective pore radius of the first wick and the second wick, and is formed with a pore structure that is different from that of the first wick and the second wick.

8. The wick structure of the heat pipe of claim 7, wherein the third wick includes a sintered wick.

\* \* \* \* \*